(12) United States Patent
Jin et al.

(10) Patent No.: US 11,444,607 B2
(45) Date of Patent: Sep. 13, 2022

(54) MANY-BIT, GROUPABLE, RECONFIGURABLE, MULTI-VALUED, ELECTRONIC OPERATOR AND ITS CONSTRUCTION METHOD

(71) Applicant: SHANGHAI UNIVERSITY, Shanghai (CN)

(72) Inventors: Yi Jin, Shanghai (CN); Shan Ouyang, Shanghai (CN); Ying Wang, Shanghai (CN); Yunfu Shen, Shanghai (CN); Junjie Peng, Shanghai (CN); Shiqiang Zhou, Shanghai (CN); Yuejun Liu, Shanghai (CN); Xunlei Chen, Shanghai (CN)

( * ) Notice: Subject to any disclaimer, the term of this patent is extended or adjusted under 35 U.S.C. 154(b) by 0 days.

(21) Appl. No.: 17/135,757

(22) Filed: Dec. 28, 2020

(65) Prior Publication Data
US 2021/0119615 A1    Apr. 22, 2021

Related U.S. Application Data

(63) Continuation of application No. PCT/CN2019/070318, filed on Jan. 4, 2019.

(30) Foreign Application Priority Data

Dec. 20, 2018  (CN) .................. 201811567284.7

(51) Int. Cl.
*H03K 3/037* (2006.01)
*G06F 13/40* (2006.01)
*H03K 19/20* (2006.01)

(52) U.S. Cl.
CPC ............. *H03K 3/037* (2013.01); *G06F 13/40* (2013.01); *H03K 19/20* (2013.01)

(58) Field of Classification Search
CPC ......... H03K 3/037; H03K 19/20; G06F 13/40
See application file for complete search history.

(56) References Cited

U.S. PATENT DOCUMENTS 9,600,048 B2    3/2017  Kim et al.
2005/0194993 A1*  9/2005  Lablans ................ H03K 19/20
                                                                    326/59

(Continued)

FOREIGN PATENT DOCUMENTS

| CN | 101067755 A | 11/2007 |
| CN | 102446342 A | 5/2012 |
| CN | 108268241 A | 7/2018 |

OTHER PUBLICATIONS

Ouyang et al, "Principle and architecture of parallel reconfiguration circuit for ternary optical computer", Shanghai University Journal, Oct. 15, 2011 (Year: 2011).*

(Continued)

*Primary Examiner* — Phong H Dang (57) ABSTRACT

Disclosed is a many-bit, groupable, reconfigurable, multi-valued, electronic operator and its construction method. Each bit of the electronic operator is provided with n column calculators and one potential combiner. A data input line is connected to an input terminal of an A signal selector, and an output terminal of the A signal selector is connected to a work permitter. Another input terminal of the work permitter is connected to a reconfiguration latch, and an output terminal of the work permitter is further connected to an output validator. Another input terminal of the output validator is connected to a power supply Vcc, and an output terminal of the output validator is connected to an output generator. Another input terminal of the output generator is connected to a reconfiguration circuit, and an output terminal of the output generator is connected to the potential combiner.

10 Claims, 5 Drawing Sheets

(56) References Cited

U.S. PATENT DOCUMENTS

| | | | |
|---|---|---|---|
| 2005/0258863 A1* | 11/2005 | Chang | H01L 27/105 |
| | | | 257/E27.081 |
| 2007/0110229 A1* | 5/2007 | Lablans | H03K 19/20 |
| | | | 380/28 |
| 2010/0164596 A1* | 7/2010 | Olexenko | G06F 7/49 |
| | | | 327/361 |
| 2016/0291669 A1 | 10/2016 | Ishii | |
| 2017/0005666 A1 | 1/2017 | Staszewski et al. | |
| 2018/0074788 A1* | 3/2018 | Kim | H03K 19/0948 |
| 2021/0132906 A1* | 5/2021 | Jin | G06E 1/04 |

OTHER PUBLICATIONS

Internation Search Report and Writen Opinion of PCT/CN2019/070318, dated Sep. 19, 2019.

* cited by examiner

MANY-BIT, GROUPABLE, RECONFIGURABLE, MULTI-VALUED, ELECTRONIC OPERATOR AND ITS CONSTRUCTION METHOD

CROSS-REFERENCE TO RELATED APPLICATIONS

This application is a continuation of International Patent Application No. PCT/CN2019/070318 with a filing date of Jan. 4, 2019, designating the United States, now pending, and further claims priority to Chinese Patent Application No. 201811567284.7 with a filing date of Dec. 20, 2018. The content of the aforementioned applications, including any intervening amendments thereto, are incorporated herein by reference.

TECHNICAL FIELD

The present invention relates to the field of computer science and technology, and in particular, to a many-bit, groupable, reconfigurable, multi-valued, electronic operator and its construction method.

BACKGROUND

Currently, the research of ternary optical computers has achieved several results. However, the main technical focus is generally an optical operator. There is still no report about application to an electronic operator.

There are two patents related to the embodiments of the present invention: [1]. No-carry no-borrow n-value n-value operator. Chinese Patent: ZL200710041144.1. Grant Date: 2009 Oct. 28. The points of the invention lie in that: 1. A general method for configuring a multi-value operator is disclosed. The main technology of the method is implemented in an optical operator but does not involve the configuration of an electronic operator. 2. The core technology of the disclosed method is a "basic operation unit". The feature of the basic operation unit is that the basic operation unit has an output of a non-D state for only one group of input data values and has an output of a D state for other input data values. All physical states outputted by all basic operation units form an n-value set. The technology in the patent only relates to an optical operator but does not involve an electronic operator. A basic operation unit in the technology can only complete the operation of one element in a logic operation truth table, resulting in severe limitations.

[2]. Reconfigurable ternary optical operator. Chinese Invention Patent: ZL201010584129.3. Grant Date: 2012 May 2. The patent discloses a technical solution of configuring a ternary optical operator, and seeks to claim the structure of a reconfiguration component and an optical component of this optical operator. The patent discloses a ternary optical operator and also does not involve an electronic operator.

SUMMARY

To apply multi-value operation to an electronic operator, the present invention researches a many-bit, groupable, reconfigurable, multi-valued, electronic operator and its construction method. Based on various theoretical results obtained in the research of ternary optical computers, a multi-value electronic operator that can be rapidly reconfigured into a specific logic operation unit is implemented. In addition, an operator with multiple bits is implemented by using an integrated manufacturing technology of electrical circuits. The feature that data bits of formed operators are not correlated is used to implement arbitrary grouping of calculator bits, and all groups of calculator bits can be independently used. Tat is, the method has characteristics that an operator has multiple bits, calculator bits can be arbitrarily grouped and independently used, and the hardware calculation function of calculator bits is reconfigurable.

In the present invention, each of the bits of the novel electronic operator can be configured into any ternary logic operator, and a plurality of calculator bits form a one-bit modified signed-digit (MSD) number adder. There is no carry relationship between data bits of this adder. The addition operation of all data bits is synchronously completed, and there is no carry correlation between the data bits. Tat is, in the present invention, any group of bits of the novel electronic operator can be configured into an operator that better satisfies a user's demand. After the user completes operation, these calculator bits can be allocated and configured again. When different group segments of calculator bits are configured into different specific operators, the novel electronic operator generally becomes a composite operator.

In the present invention, the design of the novel multi-value electronic operator starts from a truth table for n-value logic operation. Conventionally, the truth table for n-value logic operation is an n×n square table. For example, a truth table for ternary logic operation is shown in Table 1 has three rows and three columns and a total of nine elements (C00 to C22). A truth table for quaternary logic operation is shown in Table 2, and has four rows and four columns and a total of 16 elements (C00 to C33).

TABLE 1

Truth table for ternary logic operation

| | A | | |
|---|---|---|---|
| B | A0 | A1 | A2 |
| B0 | C00 | C01 | C02 |
| B1 | C10 | C11 | C12 |
| B2 | C20 | C21 | C22 |

In another aspect, there are various representation methods for the values of n-value logic. The most common one is one-dimensional n-value representation. That is, a logic value is represented by a one-bit symbol. The symbol has n different possible values. However, the values of n-value logic may be alternatively represented by a multi-bit symbol.

For example, a quaternary logic value may be represented by a one-dimensional quaternary value or may be represented by a two-dimensional binary value. When a one-dimensional quaternary value is used for representation, Cij in Table 2 is a one-bit symbol. The symbol may have four possible different values, for example, {0, 1, 2, 3} or {A, B, C, D}. A possible symbol set of the groups is the range of Cij. When a two-dimensional binary value is used for representation, Cij in Table 2 is a 2-bit symbol. Each symbol has two possible different values, for example, {0, 1} or {A,B}. In this case, the ranges of Cij are respectively {00, 01, 10, 11} and {AA, AB, BA, BB}.

TABLE 2

Truth table for quaternary logic operation

| B | A | | | |
|---|---|---|---|---|
|   | A0 | A1 | A2 | A3 |
| B0 | C00 | C01 | C02 | C03 |
| B1 | C10 | C11 | C12 | C13 |
| B2 | C20 | C21 | C22 | C23 |
| B3 | C30 | C31 | C32 | C33 |

In another example, there may be various representation manners for a ternary logic value. The most common one is one-dimensional ternary logic representation. In this case, Cij in Table 1 is a one-bit symbol. Each symbol has three different values, for example, {0, 1, 2} or {x, y, z}. However, the ternary logic value may be alternatively represented by using a two-dimensional binary value. In this case, three values first need to be chosen from four values of a two-bit binary symbol to represent ternary data. For example, {00, 01, 10} may be selected. In this case, when Cij in Table 1 is a two-bit symbol, the range of Cij is {00, 01, 10}. Obviously, when a two-dimensional binary value is used to represent a ternary logic value, there are three different selectable ranges. However, the selection of the three ranges may correspond to the same circuit structure. A professional should be able to follow the embodiments provided in the Description to complete corresponding circuits when other ranges are selected. Therefore, slight differences in circuit details caused by range selection are not distinguished in the Description. However, ternary logic operation circuits of one-dimensional ternary representation and two-dimensional binary representation have relatively obvious differences. Circuit structures that respectively correspond to the two types of ternary logic are separately provided in the embodiments in the Description (see specific embodiments for details).

An embodiment of the present invention provides a many-bit, groupable, reconfigurable, multi-valued, electronic operator, where each bit of an n-value electronic operator includes n column calculators and one potential combiner, and an output terminal of a $k^{th}$ column calculator is connected to a $k^{th}$ input terminal of the potential combiner, where each column calculator includes an output validator, an output generator, an a signal selector, a work permitter, a reconfiguration latch, and a reconfiguration circuit;

In the $k^{th}$ column calculator of an $i^{th}$ calculator bit, an input terminal of the A signal selector is connected to a $k^{th}$ line of a data input line A, and an output terminal of the A signal selector is connected to an input terminal of the work permitter; an output terminal of the work permitter is connected to a control terminal of the output validator, and a control terminal of the work permitter is connected to an output terminal of a work permit bit in the reconfiguration latch; an input terminal of the reconfiguration latch is connected to a reconfiguration command input line G, an output terminal of the work permit bit in the reconfiguration latch is connected to the control terminal of the work permitter, and output terminals of other bits in the reconfiguration latch are respectively connected to a control terminal of the reconfiguration circuit; an input terminal of the reconfiguration circuit is connected to a $k^{th}$ line of a data input line B, and an output terminal of the reconfiguration circuit is connected to an input terminal of the output generator; and a control terminal of the output generator is connected to an output terminal of the output validator, and an output terminal of the output generator is connected to the $k^{th}$ input terminal of the potential combiner, and the potential combiner of the $i^{th}$ calculator bit is configured to combine output signals of all the column calculators of the calculator bit together, to form an output signal of the calculator bit.

Further, the electronic operator includes m bits, an output signal of an $i^{th}$ bit of the electronic operator is $C_i$ (n-value), where i=0, 1, 2, ..., m−1; and each bit of the electronic operator is provided with n column calculators, an output signal of the $k^{th}$ column calculator of the $i^{th}$ calculator bit is set to $C_i^k$ (binary), where i=0, 1, 2, ..., m−1, and k=0, 1, 2, ..., n−1); and each output signal $C_i^k$ is a single signal, and all the $C_i^k$ signals include n different signals.

Further, the input terminal of the reconfiguration latch is set to be connected to a signal line of the reconfiguration command input line G, the reconfiguration command input line G is configured to write a reconfiguration command into the reconfiguration latch through the signal line of G, a G signal is a binary signal, and the reconfiguration command is generally also binary data; and output terminals of a plurality of bits for setting the electronic operator's function in the reconfiguration latch are connected to the control terminal of the reconfiguration circuit, and the plurality of bits for setting the electronic operator's function in the reconfiguration latch are configured to control the reconfiguration circuit for a filtering of a signal of a $k^{th}$ bit of data B fed into a $k^{th}$ line of the data input line B of the input terminal of the reconfiguration circuit. Therefore, the function of the reconfiguration command input line G is to provide a channel for writing the reconfiguration command into the reconfiguration latch. A signal on the G line is binary data.

Further, the reconfiguration circuit includes p branches of same structure, and p is set to the smallest integer greater than the square root of n; each branch of the reconfiguration circuit is configured to perform, according to a signal status of a control terminal of the branch of the reconfiguration circuit, selection and simple conversion on a value fed into the input terminal, and the selected and converted results are transmitted to a path of the input terminal of the output generator through an output terminal of the branch of the reconfiguration circuit; and the input terminal of the output generator includes p input lines.

Further, the control terminals of the output validator and the work permitter are set to be selective conduction; the selective conduction is defined as: when a signal at a control terminal of the device is at a high level, the input terminal and the output terminal of the device are set to be conducted; and when a signal at the control terminal is at a low level, no conduction is set between the input terminal and the output terminal of the device; and a low level is outputted.

Further, the input terminal of the A signal selector is further connected to the data input line A, the data input line A is set as a data input line with m bits and n values, and an $i^{th}$ signal line of the data input line A is connected to the input terminal of the A signal selector of each column calculator of the $i^{th}$ calculator bit.

Further, the input terminal of the reconfiguration circuit is further connected to the data input line B, the data input line B is set as a data input line with m bits and n values, and an $i^{th}$ signal line of B is connected to the input terminal of the reconfiguration circuit of each column calculator of the $i^{th}$ calculator bit.

Further, output signals of output terminals of the column calculators are set to $C_i^k$(n-value) (i=0, 1, ..., m−1, and k=0, 1, ..., n−1); the output signal $C_i^k$ is set to be inputted into the $k^{th}$ input terminal of the potential combiner of the $i^{th}$ calculator bit; one level V (n-value) with n values is also inputted into another input terminal of the potential combiner, the potential combiner is configured to select, according to an input signal $C_i^k$ at a high level, a corresponding level value Vi of V for output to form an output signal $C_i$ (n-value) (i=0, 1, . . . , m−1) of the $i^{th}$ calculator bit; and output signals $C_i$ (n-value) (i=0, 1, . . . , m−1) of all the calculator bits constitute output signals of m output terminals of the multi-value electronic operator.

An embodiment of the present invention provides a method of using a many-bit, groupable, reconfigurable, multi-valued, electronic operator, including:

step 1. writing, through a signal line G, a reconfiguration command into a reconfiguration latch of each column calculator of a required calculator bit;

step 2. sending a pair of current values of original data to a data input line A and a data input line B respectively;

step 3. receiving calculation results of output terminals of column calculators of all the calculator bits; and step 4. repeating step 2 and step 3 such that all original data have been calculated.

For example, for a ternary operator, if the $100^{th}$ bit to the $105^{th}$ bit of the ternary operator need to be reconfigured into a ternary logic operator, a specific truth table for ternary logic operation first needs to be written, as shown in Table 1 in the Description. Reconfiguration commands, that is, a group of binary data, to be written into three reconfiguration latches are then determined according to Table 6 (a relationship between a ternary logic reconfiguration value and an output (low bit) of a column calculator) of Embodiment 2 in the Description. The three reconfiguration commands are respectively transmitted to the signal line G. At the same time, the reconfiguration latches of the $100^{th}$ calculator bit to the $105^{th}$ calculator bit are chosen, to enable these reconfiguration latches to receive corresponding reconfiguration commands. In this way, the $100^{th}$ calculator bit to the $105^{th}$ calculator bit are configured into a required ternary logic operator.

It is assumed that the foregoing configured ternary logic operator needs to be used to process ten thousand pairs of data. Each pair of data has two values a1 and b1. If the first pair of data is a1=tfuffu and b1=ffuttu, where f, t, and u are three logic values, ternary data a1 and ternary data b1 are respectively transmitted to the $100^{th}$ bit to the $105^{th}$ bit of signal lines A and B. The results are the same regardless of which piece of data is fed into the signal line A.

After the data a1 and the data b1 are fed into the $100^{th}$ calculator bit to the $105^{th}$ calculator bit, an operational result c1 may be obtained at output terminals of the $100^{th}$ bit to the $105^{th}$ calculator bit.

Other data of a1 and b1 is then fed piece by piece, and a corresponding calculation result c1 is obtained, until all original data have been calculated.

e method of using a many-bit, groupable, reconfigurable, multi-valued, electronic operator provided in this embodiment of the present invention has the following technical effects:

1. A basic circuit unit is characterized by a "column (row) logic operator".

In the embodiments of the present invention, a circuit unit that can complete all logic operation corresponding to n elements in one column (or row) in one truth table for n-value logic operation is referred to as a column (or row) logic operator, and is referred to as a column calculator for short in the Description.

An n-value circuit unit in the embodiments of the present invention includes one reconfiguration latch. Different values are fed into the reconfiguration latch to configure the n-value circuit unit into a specific n-value column calculator. When values kept in the reconfiguration latch are updated, a corresponding circuit unit is reconfigured into another column calculator. Each possible value of the reconfiguration latch corresponds to one specific n-value column calculator. All possible values of the reconfiguration latch correspond to all n-value column calculators. Therefore, a one-bit n-value logic operator can definitely be configured by using n circuit units in the embodiments of the present invention. Therefore, n n-value circuit units in the embodiments of the present invention form one bit of the novel electronic operator of the present invention. Therefore, m bits of the novel electronic operator can be configured into an m-bit n-value logic operator, and logic operators configured on calculator bits may be different.

2. Logic operation of a truth table having m rows and n columns (m≠n) can be completed.

A truth table for such logic operation is a case in which one row or column is deleted from Table 1 or Table 2. Although such logic operation is rare in life, two such ternary logic operators are used in a JS-MSD parallel adder configured by using a ternary optical computer. It means such logic operation is significant in theoretical and actual work. The reconfigurability of the many-bit electronic operator implemented in the embodiments of the present invention enables the multi-value electronic operator to conveniently complete such logic operation.

3. Various adders such as a binary parallel adder using an MSD number may be configured by using column (row) ternary logic operators configured in the embodiments of the present invention.

DETAILED DESCRIPTION OF EMBODIMENTS

The present invention is further described below with reference to the accompanying drawings and specific implementations.

In the embodiments of the present invention, the content of the present invention are respectively described in detail by using the structure of a quaternary logic operation electronic operator, the structure of a ternary logic operation electronic operator, and the structure of a binary logic operation electronic operator as embodiments. However, the patent also encompasses other multi-value logic electronic operator.

Figure 1:
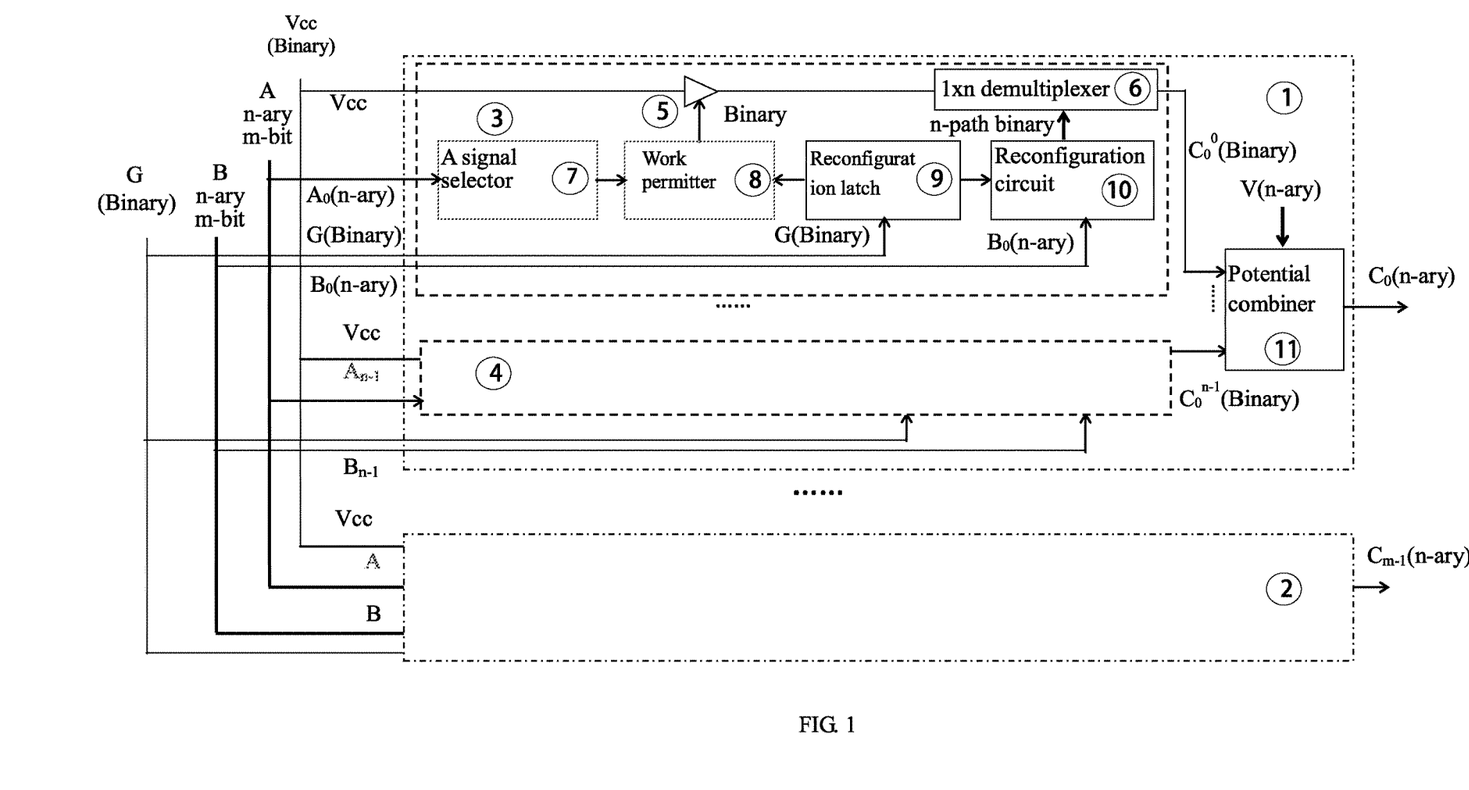
FIG. 1 is a schematic diagram of the general structure of a groupable, reconfigurable, multi-value and many-bit electronic operator according to the present invention, characterized by that calculator bits of a multi-value operator are configured based on column calculators.

The general structure, the connection relationships between components, and the working principle of a multi-value electronic operator are described below with reference to FIG. 1.

In the general structure, there may be m bits in n-value electronic processing. m may be any positive integer, for example, m=5000000 or a larger number. Each bit (① and ②) of the multi-value electronic operator includes n (n is a positive integer greater than 1) column calculators (③ and ④) and one potential combiner (⑪) provided with n input terminals. An output terminal of a $k^{th}$ column calculator is connected to a $k^{th}$ input terminal of the potential combiner, where k=0, 1, . . . , n−1; and the output of the $i^{th}$ potential combiner is set as an output of an $i^{th}$ calculator bit, where i=0, 1, . . . , m−1. For example, an output of the $k^{th}$ column calculator included in the $i^{th}$ calculator bit is $C_i^k$ (i=0, 1, . . . , m−1, and k=0, 1, . . . , n−1). Each $C_i^k$ is fed into the $k^{th}$ input terminal of the potential combiner of the $i^{th}$ calculator bit, and an output terminal of the potential combiner is transmitted to an operational result of the id calculator bit. and an operational result of the $i^{th}$ calculator bit is output from the output terminal of the $i^{th}$ potential combiner.

Each column calculator of the multi-value electronic operator includes components such as an output validator (⑤), an output generator (⑥), an A signal selector (⑦), a work permitter (⑧), a reconfiguration latch (⑨), and a reconfiguration circuit (⑩).

Connections among the components are as follows: Input terminals of the A signal selectors of all column calculators of the $i^{th}$ calculator bit are connected to an $i^{th}$ line of a data input line A, and output terminals of the A signal selectors of the column calculators are connected to an input terminal of the work permitter, an output terminal of the work permitter is connected to a control terminal of the output validator, and a control terminal of the work permitter is connected to an output terminal of a work permit bit in the reconfiguration latch; an input terminal of the reconfiguration latch is connected to a reconfiguration command input line G, an output terminal of the work permit bit in the reconfiguration latch is connected to the control terminal of the work permitter, and output terminals of other bits in the reconfiguration latch are respectively connected to a control terminal of the reconfiguration circuit; an input terminal of the reconfiguration circuit is connected to an $i^{th}$ line of a data input line B, and each line in the output terminal is connected to a line of an input terminal of the output generator, and a control terminal of the output generator is connected to an output terminal of the output validator, and an output terminal of the output generator is connected to an input terminal of the potential combiner.

The working principle of the multi-value electronic operator is as: A reconfiguration command written into the reconfiguration latch by using the line G is used to determine a calculation function of each column calculator, that is, to implement one of $n^{(n \times n)}$ types of n-value logic operation or no any function. When the work permit bit in the reconfiguration latch is 0, the reconfiguration latch controls the work permitter to keep outputting 0, so as to control the output validator to keep outputting 0, and the output of the output generator is kept to be 0. The output value of the column calculator is always 0 and is not related to input data. That is, the column calculator does not have an operational capability. When the work permit bit in the reconfiguration latch is 1, the reconfiguration latch controls the work permitter to be turned on, an output signal of the A signal selector passes through the work permitter to reach the control terminal of the output validator. If the value of an $i^{th}$ bit of a current data line A does not satisfy a selection requirement of the A signal selector, the A signal selector outputs 0. Therefore, the current value of the control terminal of the output validator is 0. In this case, the current output of the column calculator is 0. That is, the column calculator does not perform operation on an $i^{th}$ bit of the current A value. If the value of an $i^{th}$ bit of the current data line A satisfies the selection requirement of the A signal selector, the A signal selector outputs 1. In this case, the current value of the control terminal of the output validator is 1, and the output value of the output validator is also 1. In this case, potential conversion for a signal at the input terminal of the output generator is performed in the output generator, to form an operational result signal of the processing of the column calculator and transmits the operational result signal from the output terminal of the output generator. The operational result signal is referred to as $C_i^k$ (a calculation result of the $k^{th}$ column calculator of the $i^{th}$ calculator bit). The reconfiguration circuit is provided with a total of p branches, where p is the smallest integer greater than the square root of n. Each branch of the reconfiguration circuit is configured to perform, according to a signal status of a branch control terminal, selection and simple conversion on the value of an $i^{th}$ bit of data B fed by a branch input terminal, and transmit the selected and converted results to a path of the input terminal of the output generator through an output terminal of the branch. The input terminal of the output generator is also provided with p input lines.

The potential combiner of the $i^{th}$ calculator bit is configured to combine output signals of all the column calculators of the calculator bit together, to form an output physical signal of the calculator bit. Because any value of an $i^{th}$ bit of the data A definitely satisfies the selection requirement of the A signal selector of one column calculator, the calculator bit can definitely complete the logic operation for any value of an $i^{th}$ bit of the data A and an $i^{th}$ bit of the data B.

That is, in the present invention, any group of bits of the novel electronic operator can be configured into an operator that better satisfies a user's demand.

Embodiment 1

Figure 2:
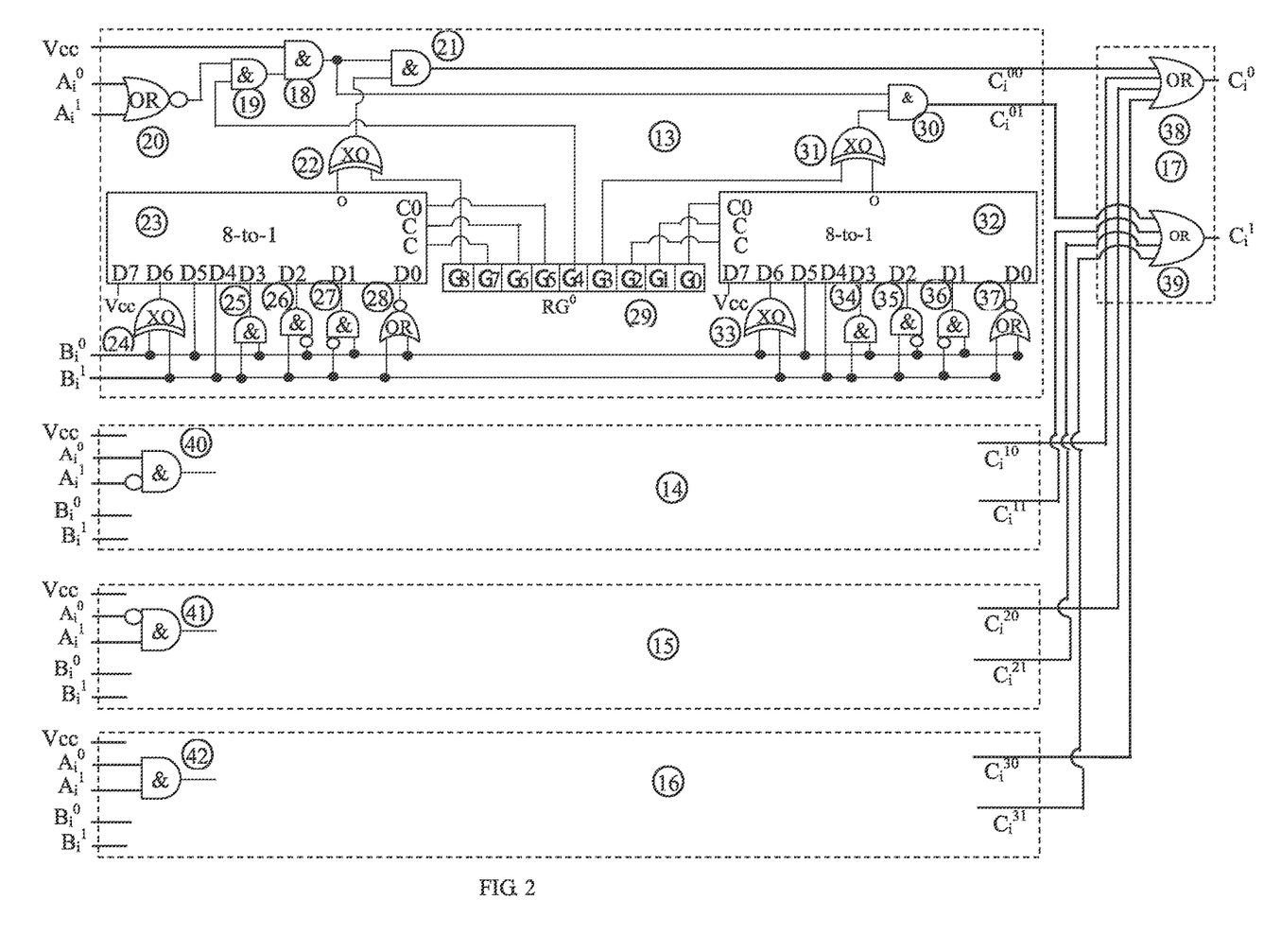
FIG. 2 is a schematic structural diagram of an electronic operator according to Embodiment 1 of the present invention, describing a specific structure of a groupable and reconfigurable quaternary many-bit electronic operator, characterized by that a two-bit binary symbol is used to represent quaternary logic operation.

The structure of a quaternary logic electronic operator represented by using a two-bit binary symbol is described in this embodiment. The electronic operator may have m bits. Each bit has the same structure and working principle, as shown in FIG. 2. Therefore, only an $i^{th}$ bit of the electronic operator is described in detail with reference to FIG. 2 in the Description, where i=0, 1, . . . , m−1.

Each bit of the quaternary logic electronic operator in this embodiment of the present invention includes four column calculators (⑬, ⑭, ⑮, and ⑯) and one potential combiner (⑰) formed by two four-input OR gates (㊳ and ㊴). The differences between the four column calculators only lie in that the A signal selectors (⑳, ㊵, ㊶, and ㊷) have different structures. ⑳ is a NOR gate, and two input terminals of ⑳ may be arbitrarily connected to $A_i^1$ (a high bit of an $i^{th}$ line of a data line A) and $A_i^0$ (a low bit of an $i^{th}$ line of the data line A). ㊵ is an AND gate with a single NOT input terminal, an input terminal with a NOT gate is connected to $A_i^0$, and another input terminal is connected to $A_i^0$. ㊶ is also an AND gate with NOT gate in one input terminal, an input terminal with a NOT gate is connected to $A_i^0$, and another input terminal is connected to $A_i^0$. ㊷ is an AND gate, and two input terminals may be arbitrarily connected to $A_i^1$ and $A_i^0$. In view of that the remaining parts of the four column calculators are identical, the circuit structure and working principle of only one column calculator are described in detail in the Description.

In this embodiment, each column calculator includes an output validator, an output generator, an A signal selector, a work permitter, a reconfiguration latch, and a reconfiguration circuit. The output validator is implemented as an AND gate ⑱. The output generator is implemented as two AND gates ㉑ and ㉚. The A signal selectors are respectively implemented as a NOR gate ⑳, AND gates with NOT gate in one input terminal ㊵ and ㊶, and an AND gate ㊷. The work permitter is implemented as an AND gate ⑲. The reconfiguration latch is implemented as a latch $RG_i^0$ ㉙. Similarly, $RG_i^k$ is used to label the reconfiguration latch in a $k^{th}$ column calculator of an $i^{th}$ calculator bit. The reconfiguration circuit is implemented as two components. One component is formed by an 8-to-1 selector ㉓, XOR gates ㉒ and ㉔, an AND gate ㉕, AND gates with a NOT gate in one input terminal ㉖ and ㉗, and a NOR gate ㉘. The other component is formed by an 8-to-1 selector ㉜, XOR gates ㉛ and ㉝, an AND gate ㉞, AND gates with NOT gate in one input terminal ㉟ and ㊱, and a NOR gate ㊲.

The connections among the parts in the column calculator are as: The two input terminals of the NOR gate ⑳ (the A signal selector) are respectively connected to two-bit coding lines $A_i^0$ and $A_i^1$ of an $i^{th}$ data line $A_i$. An output terminal of ⑳ is connected to an input terminal of the AND gate ⑲ (the work permitter), and another input terminal (a control terminal of the work permitter) of ⑲ is connected to an output terminal of a G4 bit (a work permit bit) of the reconfiguration latch ㉙. An output terminal of ⑲ is connected to an input terminal (a control terminal of the output validator) of the AND gate ⑱ (the output validator). Another input terminal of ⑱ is connected to a power supply Vcc (a high level). An output terminal of ⑱ is connected to both input terminals (a control terminal of the branch of the output generator) of the AND gates ㉑ and ㉚ (a low bit branch and a high bit branch of the output generator). Other input terminals of ㉑ and ㉚ are respectively connected to output terminals (output terminals of the two branches of the reconfiguration circuit) of the XOR gates ㉒ and ㉛. An output terminal (a low bit output signal of the column calculator) of ㉑ is connected to an input terminal of an OR gate ㊳ (a low bit branch of the potential combiner). An output terminal (a high bit output signal of the column calculator) of ㉚ is connected to an input terminal of an OR gate ㊴ (a high bit branch of the potential combiner). Other input terminals of ㊳ and ㊴ are respectively connected to corresponding output signals of other column calculators of the $i^{th}$ calculator bit. Output terminals of ㊳ and ㊴ transmit a low bit value $C_i^0$ and a high bit value $C_i^1$ of an operational result of the $i^{th}$ calculator bit. Output terminals of a G7 bit, a G6 bit, and a G5 bit (B signal selection bit groups for low bits of results) of the reconfiguration latch ㉙ are connected to input port selection terminals C2, C1, and C0 of the 8-to-1 selector ㉓. Eight input ports of ㉓ are respectively connected to one circuit for filtering a $B_i$ signal. In the circuit, a D0 port is connected to an output terminal of the NOR gate ㉘, D1 is connected to an output terminal of the AND gate with a NOT gate in one input terminal ㉗, D2 is connected to an output terminal of the AND gate with a NOT gate in one input terminal ㉖, D3 is connected to an output terminal of the AND gate ㉕, D4 is connected to the high bit $B_i^1$ of a $B_i$ signal line, D5 is connected to the low bit $B_i^0$ of the $B_i$ signal line, D6 is connected to an output terminal of an XOR gate ㉔, and D7 is connected to a high level Vcc. A G8 bit of the reconfiguration latch ㉙ is connected to an input terminal of an XOR gate ㉒ and another input terminal of ㉒ is connected to an output terminal O of the 8-to-1 selector ㉓, so when the G8=1, the output signal of 8-to-1 selector ㉓ is flipped by the XOR gate ㉒. The output terminal of ㉒ is connected to an input terminal of the AND gate ㉑ (a low bit branch of the output generator). Output terminals of a G2 bit, a G1 bit, and a G0 bit (a B signal selection bit group for high bit of a result) of the reconfiguration latch are connected to input port selection terminals C2, C1, and C0 of the 8-to-1 selector ㉜. The eight input ports of ㉜ are respectively connected to one circuit for filtering a $B_i$ signal. In the circuit, a D0 port is connected to an output terminal of the NOR gate ㊲, D1 is connected to an output terminal of the AND gate ㊱ with a NOT gate in one input terminal, D2 is connected to an output terminal of the AND gate ㉟ with a NOT gate in one input terminal, D3 is connected to an output terminal of the AND gate ㉞, D4 is connected to a high bit $B_i^1$ of the $B_i$ signal line, D5 is connected to a low bit $B_i^0$ of the $B_i$ signal line, D6 is connected to an output terminal of the XOR gate ㉝, and D7 is connected to the high level Vcc. A G3 bit of the reconfiguration latch ㉙ is connected to an input terminal of an XOR gate ㉛ and another input terminal of ㉛ is connected to an output terminal O of the 8-to-1 selector ㉜, so when the G3=1, the output signal of 8-to-1 selector ㉜ is flipped by the XOR gate ㉛. The output terminal of ㉛ is connected to an input terminal of the AND gate ㉚ (a high bit branch of the output generator). Two input terminals of the devices ㉔, ㉕, ㉖, ㉗, ㉘, ㉝, ㉞, ㉟, ㊱, and ㊲ are respectively connected to the high bit line $B_i^1$ and the low bit line $B_i^0$ of the data line $B_i$. Input terminals with a NOT gate of ㉖ and ㉟ are connected to $B_i^0$, and input terminals with a NOT gate of ㉗ and ㊱ are connected to $B_i^1$.

The working principle of a column calculator is as follows:

1. The A signal sectors ⑳, ㊵, ㊶, and ㊷ of the four column calculators have different structures. ⑳ is a NOR gate, ㊵ and ㊶ are AND gates with a NOT gate in one input terminal, and ㊷ is also an AND gate. Therefore, when a two-bit binary symbol $A_i^1 A_i^0$ of an $i^{th}$ bit $A_i$ of data A are 00, and ⑳ outputs a high level. If another input terminal of the AND gate ⑲ is also at a high level, that is, the G4 bit of the reconfiguration latch ㉙ is 1, ⑲ outputs a high level to an input terminal of the AND gate ⑱, and another input terminal of ⑱ is a power supply potential Vcc (a high level). Therefore, ⑱ outputs a high level. This process functionally implements that when $A_i^1 A_i^0 = 00$, a high level passes through the AND gate ⑱ to reach input terminals (a control terminal of the output generator) of the AND gates ㉑ and ㉚. In this case, output signals $C_i^{01}$ and $C_i^{00}$ of the column calculator ⑬ may be respectively outputted at a high level or a low level. Therefore, the output signal $C_i = C_i^1 C_i^0$ of the calculator bit may be chosen from the range {00, 01, 10, 11}. It may be seen that in this case the column calculator ⑬ is in an active state. At the same time, the A signal selectors ㊵, ㊶, and ㊷ of the remaining three column calculators all output a low level. Therefore, none of the three column calculators is active. Similarly, when $A_i^1 A_i^0 = 01$, the column calculator ⑭ is active. When $A_i^1 A_i^0 = 10$, the column calculator ⑮ is active. When $A_i^1 A_i^0 = 11$, the column calculator ⑯ is active. That is, for any value of an $i^{th}$ bit $A_i$ of the input data A, only one column calculator is active. That is, only one column calculator may output a high level at any moment.

2. In view of that only one of the four column calculators may output a high level at any moment, the remaining three column calculators all output a low level. Therefore, an output signal combiner ⑰ is formed by two 4-input OR gates ㊳ and ㊴. ㊳ performs OR on low bit values of output signals of the four column calculators to generate a low bit $C_i^0$ of an output signal of the $i^{th}$ calculator bit. ㊴ performs OR on high bit values of output signals of the four column calculators to generate a high bit $C_i^1$ of an output signal of the calculator bit.

3. Because the differences among the four column calculators only lie in that the structures of the A signal selectors ⑳, ㊵, ㊶, and ㊷ are different, and the remaining parts are identical, only the column calculator ⑬ is described below.

The latch ㉙ is a reconfiguration command latch. A value (a reconfiguration command) that is written into the latch ㉙ determines an electronic operator's function of ⑬. The lowest three bits (G2, G1, G0) of ㉙ are connected to input port selection terminals (C2, C1, C0) of the 8-to-1 selector ㉜. Therefore, the values of G2, G1, and G0 determine which of the eight input ports (D7 to D0) of ㉜ is in communication with an output port O. See Table 3 for a gating relationship.

TABLE 3

Gating relationship between output ports and input ports of the 8-to-1 selector

| C2C1C0 | 000 | 001 | 010 | 011 | 100 | 101 | 110 | 111 |
|---|---|---|---|---|---|---|---|---|
| Input Port | D0 | D1 | D2 | D3 | D4 | D5 | D6 | D7 |

The G3 bit of the latch ㉙ controls the NOT function of the XOR gate ㉛. When G3=1, the XOR gate ㉛ performs NOT on a signal outputted by the port O of ㉜. When G3=0, ㉛ does not perform NOT on the signal outputted by the port O. An output signal of the XOR gate ㉛ is connected to the input terminal of the AND gate ㉚. Therefore, when an input of another input terminal (the control terminal) of ㉚ is 1 (a high level), ㉚ is open to the output signal of ㉛. That is, an output level of ㉚ is kept consistent with an output level of ㉛. Therefore, an output signal of ㉛ is generated as a high bit value $C_i^{01}$ of an operational result of the column calculator ⑬. Therefore, the lowest four bits (G3, G2, G1, and G0) of the reconfiguration latch determine which value of which input port of the 8-to-1 selector ㉜ can enable the high bit $C_i^{01}$ of the output signal of the column calculator ⑬ to be at a high level. Similarly, the highest four bits (G8, G7, G6, and G5) of the latch ㉙ determine which value of which input port of the 8-to-1 selector ㉓ can enable $C_i^{00}$ in the output signal of the column calculator to be at a high level.

4. The middle bit G4 of the latch ㉙ is connected to an input terminal (the control terminal of the work permitter) of the AND gate ⑲. When G4=1, ⑲ is open to another input terminal, that is, open to an output signal of the A signal selector. If ⑳ outputs a high level, ⑲ also outputs a high level. Therefore, the AND gate ⑱ also outputs a high level. In this case, the column calculator ⑬ is in an active state, and is a current working part of the $i^{th}$ calculator bit. When G4=0, the AND gate ⑲ definitely outputs a low level, that is, is closed to another input terminal. Therefore, the output of the AND gate ⑱ is also always at a low level. Therefore, the AND gates ㉑ and ㉚ also always output a low level. That is, $C_i^{00}$ and $C_i^{01}$ both have a 0 value, and do not effect in OR gates ㊳ and ㊴. It is functionally implemented that the column calculator ⑬ is inactive, that is, does not participate in the operation of the $i^{th}$ calculator bit. In this case, a logic operation truth table that the $i^{th}$ calculator bit follows is equivalent to a 4×3 table that remains after a corresponding column is deleted from Table 2. Therefore, G4 determines whether the column calculator ⑬ is a part of the $i^{th}$ bit of a current logic operator.

Obviously, if the logic operation truth table that the operator currently follows is a 4×3 table, G4=0 needs to be set in reconfiguration latches of column calculators corresponding to missing columns in the table.

5. The input signals of the 8-to-1 selectors ㉓ and ㉜ are identical. Only the input signals and function of ㉓ are described below. A two-bit binary symbol $B_i^1 B_i^0$ of an $i^{th}$ bit $B_i$ of input data B undergoes NOR by ㉘ before being fed into a D0 terminal, and therefore the D0 terminal is connected to a high level only when $B_i^1 B_i^0 = 00$. The NOT of $B_i^1$ and $B_i^0$ undergo AND by ㉗ before being fed into a D1 terminal, and therefore the D1 terminal is connected to a high level only when $B_i^1 B_i^0 = 01$. $B_i^1$ and the NOT of $B_i^0$ undergo AND by ㉖ before being fed into the D2 terminal, and therefore the D2 terminal is connected to a high level only when $B_i^1 B_i^0 = 10$. $B_i^1 B_i^0$ undergoes AND by ㉕ before being fed into a D3 terminal, and therefore the D3 terminal is connected to a high level only when $B_i^1 B_i^0 = 11$. $B_i^0$ is directly fed into a D4 terminal, and therefore the D4 terminal is connected to a high level provided that $B_i^0 = 1$. $B_i^1$ is directly fed into a D5 terminal, and therefore the D5 terminal is connected to a high level provided that $B_i^1 = 1$. $B_i^1 B_i^0$ undergoes XOR by ㉔ before being fed into a D6 terminal, and therefore the D6 terminal is connected to a high level provided that $B_i^1$ and $B_i^0$ are different. Vcc is directly fed into a D7 terminal, and therefore D7 is connected to a high level regardless of the value of the B data.

As can be seen from Table 3, when selection terminals C2, C1, and C0 of ㉓ are 000, the D0 input port is gated. In this case, only the value of D0 is transmitted to the port O for output, and values of other input ports cannot pass through ㉓. The only way of enabling C2, C1, and C0 of ㉓ to be 000 is to write 000 into G7, G6, and G5 of the latch ㉙. If 0 is also written into G8, when $B_i^1 B_i^0 = 00$, an input of the D0 port of ㉓ is at a high level, and as a result the port O of ㉓ outputs a high level, to further enable the XOR gate ㉓ to output a high level and enable the AND gate ㉑ to output a high level. Therefore, the output $C_i^{00}$ of the column calculator is at a high level. When $B_i^1 B_i^0 \neq 00$, $C_i^{00}$ is at a low level. Similarly, see Table 4 for the impact of G8, G7, G6, and G5 of the latch ㉙ having other values on the value of the output value of $C_i^{00}$ may be analyzed. In consideration of that the impact of G3, G2, G1, and G0 on the output value of $C_i^{01}$ is identical with the impact of G8, G7, G6, and G5 on the output value of $C_i^{00}$, a value that should be written into the latch ㉙ when one column calculator is configured into a specific column calculator may be determined from Table 4. This value is referred to as a column reconfiguration command. Correspondingly, ㉙ is referred to as a column reconfiguration latch.

TABLE 4

Relationship between a quaternary logic reconfiguration latch value and an output (a low bit) of a column calculator

| G8 | x | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|
| G7 G6 | xx | 00 | 00 | 01 | 01 | 10 | 10 | 11 | 00 | 00 | 00 | 01 | 01 | 10 | 10 | 11 | 00 |
| G5 G4 | x0 | 01 | 11 | 01 | 11 | 01 | 11 | 01 | 01 | 01 | 11 | 01 | 11 | 01 | 11 | 01 | 01 |
| B1B0 = 00 | Not working | 1 | 0 | 0 | 0 | 0 | 0 | 0 | 1 | 0 | 1 | 1 | 1 | 1 | 1 | 1 | 0 |
| B1B0 = 01 | working | 0 | 1 | 0 | 0 | 1 | 0 | 1 | 1 | 1 | 0 | 1 | 1 | 0 | 1 | 0 | 0 |
| B1B0 = 10 |  | 0 | 0 | 1 | 0 | 0 | 1 | 1 | 1 | 1 | 1 | 0 | 1 | 1 | 0 | 0 | 0 |
| B1B0 = 11 |  | 0 | 0 | 0 | 1 | 1 | 1 | 0 | 1 | 1 | 1 | 1 | 0 | 0 | 0 | 1 | 0 |

6. Based on Table 4, each bit of the m-bit operator may be reconfigured into on bit of a quaternary logic operator, so that the entire operator becomes a composite operator having various quaternary logic operators. A sum of quantities of bits of the logic operators is m. A large amount of original data may then be calculated piece by piece in the operator. Specific operations are as follows:

1) Write a truth table for required logic operation. Refer to Table 2.

2) If the truth table lacks a column, write 0 into a G4 bit of a column calculator corresponding to the column. If the truth table lacks a row, rows and columns of the truth table are exchanged to obtain a truth table that lacks a column.

3) Look up Table 4 according to the locations of 1 in the truth table, and write the values of G8 to G0.

4) Write G8 to G0 into the reconfiguration latch ㉙ of each column calculator.

5) Write the original data pair by pair into data input terminals A and B of calculator bits.

6) Obtain a calculation result at a terminal C of an calculator bit.

Embodiment 2

Figure 3:
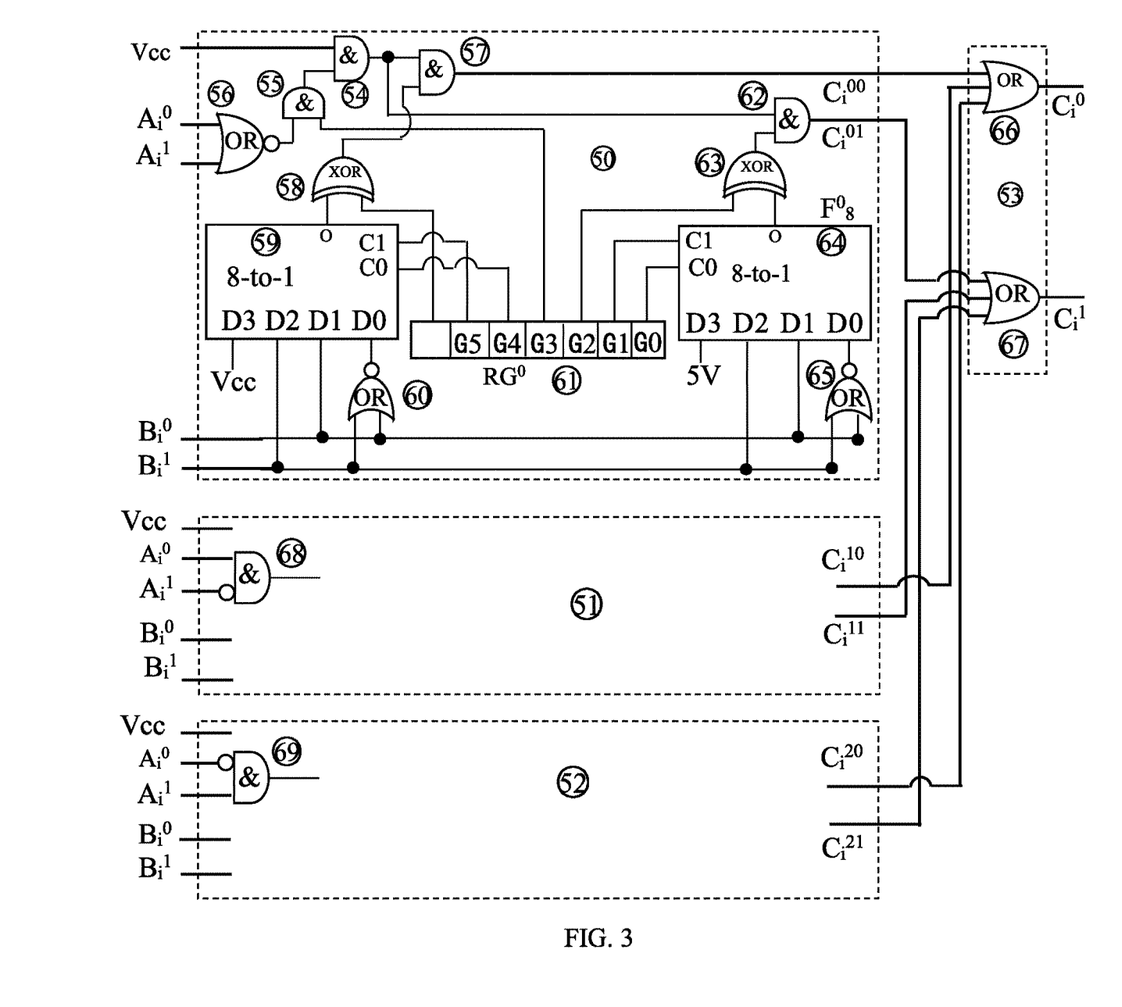
FIG. 3 is a schematic structural diagram of an electronic operator according to Embodiment 2 of the present invention, describing a specific structure of a groupable and reconfigurable ternary many-bit electronic operator, characterized by that a two-bit binary symbol is used to represent ternary logic operation.

The structure of a ternary logic electronic operator represented by using a two-bit binary symbol is described in this embodiment. The electronic operator may have m bits. Each bit has the same structure and working principle, as shown in FIG. 3. Therefore, only an $i^{th}$ bit of the electronic operator is described in detail with reference to FIG. 3 in the Description, where i=0, 1, . . . , m−1.

In this embodiment, two-bit binary symbols 00, 01, and 10 are selected to represent ternary data. When 11 and two other symbols are selected to represent ternary data, only an A signal selector is changed in a corresponding circuit. Such a change has been described in detail in the description of the general structure with reference to FIG. 1. Therefore, the selection of different symbols should not narrow down the scope of this embodiment.

Each bit of the ternary logic electronic operator in this embodiment of the present invention includes three column calculators (㊿, ㊿, and ㊿) and one potential combiner (㊿) formed by two three-input OR gates (㊿ and ㊿). The differences among the three column calculators only lie in that the structures of the A signal selectors ㊿, ㊿, and ㊿ are different. ㊿ is a NOR gate, of which two input terminals may be arbitrarily connected to $A_i^1$ (a high bit of an $i^{th}$ line of a data line A) and $A_i^0$ (a low bit of an $i^{th}$ line of the data line A). ㊿ is an AND gate with a NOT gate in one input terminal, an input terminal with a NOT gate is connected to $A_i^1$, and another input terminal is connected to $A_i^0$. ㊿ is also an AND gate with a NOT gate in one input terminal, an input terminal with a NOT gate is connected to $A_i^0$, and another input terminal is connected to $A_i^1$. In view of that the remaining parts of the three column calculators are identical, the circuit structure and working principle of only one column calculator are described in detail in the Description.

In this embodiment, each column calculator includes an output validator, an output generator, an A signal selector, a work permitter, a reconfiguration latch, and a reconfiguration circuit. The output validator is implemented as an AND gate ㊿. The output generator is implemented as two AND gates ㊿ and ㊿. The A signal selectors are respectively implemented as a NOR gate ㊿ and AND gates ㊿ and ㊿ with a NOT gate in one input terminal. The work permitter is implemented as an AND gate ㊿. The reconfiguration latch is implemented as latch $RG_i^0$ ㊿. Similarly, $RG_i^k$ is used to label the reconfiguration latch in a $k^{th}$ column calculator of an $i^{th}$ calculator bit. The reconfiguration circuit is implemented as two branch components. One component is formed by an XOR gate ㊿, a 4-to-1 selector ㊿, and a NOR gate ㊿. The other component is formed by an XOR gate ㊿, a 4-to-1 selector ㊿, and a NOR gate ㊿.

The connections among the parts in the column calculator are as follows: The two input terminals of the NOR gate ㊿ (the A signal selector) are respectively connected to two-bit coding lines $A_i^0$ and $A_i^1$ of an $i^{th}$ data line $A_i$. An output terminal of ㊿ is connected to an input terminal of the AND gate ㊿ (the work permitter), and another input terminal (a control terminal of the work permitter) of ㊿ is connected to an output terminal of a G3 bit (a work permit bit) of the reconfiguration latch ㊿. An output terminal of ㊿ is connected to an input terminal (a control terminal of the output validator) of the AND gate ㊿ (the output validator). Another input terminal of ㊿ is connected to a power supply Vcc (a high level). An output terminal of ㊿ is connected to both input terminals (a control terminal of the branch of the output generator) of the AND gates ㊿ and ㊿ a low bit branch and a high bit branch of the output generator with a NOT gate in one input terminal of ㊿ and ㊿ are respectively connected to output terminals (output terminals of the two branches of the reconfiguration circuit) of the XOR gates ㊿ and ㊿. An output terminal (a low bit output signal of the column calculator) of ㊿ is connected to an input terminal of the OR gate ㊿ (a low bit branch of the potential combiner). An output terminal (a high bit output signal of the column calculator) of ㊿ is connected to an input terminal of the OR gate ㊿ (a high bit branch of the potential combiner). Other input terminals of ⑥⑥ and ⑥⑦ are respectively connected to corresponding output signals of two other column calculators ⑤① and ⑤② of the $i^{th}$ calculator bit. Output terminals of ⑥⑥ and ⑥⑦ transmit a low bit value $C_i^0$ and a high bit value $C_i^1$ of an operational result of the $i^{th}$ calculator bit. Output terminals of a G5 bit and a G4 bit (B signal selection bit groups of low bits of results) of the reconfiguration latch ⑥① are connected to input port selection terminals C1 and C0 of the 4-to-1 selector ⑤⑨. Four input ports of ⑤⑨ are respectively connected to one circuit for filtering a $B_i$ signal. In the circuit, a D0 port is connected to an output terminal of the NOR gate ⑥⓪, D1 is connected to low bit $B_i^0$ of a $B_i$ signal line, D2 is connected to the high bit $B_i^1$ of the $B_i$ signal line, and D3 is connected to a high level Vcc. A G6 bit (a low bit output NOT bit) of the reconfiguration latch ⑥① is connected to an input terminal (a low bit output NOT control terminal) of the XOR gate ⑤⑧. Another input terminal of ⑤⑧ is connected to an output terminal of the 4-to-1 selector ⑤⑨. An output terminal of ⑤⑧ is connected to an input terminal of the AND gate ⑤⑦ (a low bit branch of the output generator). Output terminals of a G1 bit and a G0 bit (a B signal selection bit group of a high bit of a result) of the reconfiguration latch ⑥① are connected to input port selection terminals C1 and C0 of the 4-to-1 selector ⑥④. The four input ports of ⑥④ are respectively connected to one circuit for filtering a $B_i$ signal. In the circuit, a D0 port is connected to an output terminal of the NOR gate ⑥⑤, D1 is connected to a low bit $B_i^0$ of the $B_i$ signal line, D2 is connected to a high bit $B_i^{th}$ of the $B_i$ signal line, and D3 is connected to the high level Vcc. A G2 bit (a high bit output NOT bit) of the reconfiguration latch ⑥① is connected to an input terminal (a high bit output NOT control terminal) of the XOR gate ⑥③, and another input terminal of ⑥③ is connected to an output terminal of the 4-to-1 selector ⑥④. An output terminal of ⑥③ is connected to an input terminal of the AND gate ⑥② (a high bit branch of the output generator). Two input terminals of the devices ⑥⓪ and ⑥⑤ are respectively connected to the high bit line $B_i^1$ and the low bit line $B_i^0$ of the data line $B_i$.

The working principle of a column calculator is as follows:

1. The A signal selectors ⑤⑥, ⑥⑧, and ⑥⑨ of the three column calculators have different structures. ⑤⑥ is a NOR gate, ⑥⑧ and ⑥⑨ are AND gates with a NOT gate in one input terminal. Therefore, when a two-bit binary symbol $A_i^1A_i^0$ of an $i^{th}$ bit $A_i$ of data A are 00, ⑤⑥ outputs a high level. If another input terminal of the AND gate ⑤⑤ is also at a high level, that is, the G3 bit of the reconfiguration latch ⑥① is 1, outputs a high level to an input terminal of the AND gate ⑤④, and another input terminal of ⑤④ is a power supply potential Vcc (a high level). Therefore, ⑤④ outputs a high level. This process functionally implements that when $A_i^1A_i^0=00$, a high level passes through the AND gate ⑤④ to reach input terminals (a control terminal of the output generator) of the AND gates ⑤⑦ and ⑥②. In this case, output signals $C_i^{00}$ and $C_i^{00}$ of the column calculator ⑤⓪ may be respectively outputted at a high level or a low level. Therefore, the output signal $C_i=C_i^1C_i^0$ of the calculator bit may be chosen from the range {00, 01, 10}. It may be seen that in this case the column calculator ⑤⓪ is in an active state. At the same time, the A signal selectors ⑥⑧ and ⑥⑨ of the remaining two column calculators both output a low level. Therefore, neither of the two column calculators is active. Similarly, when $A_i^1A_i^0=01$, the column calculator ⑤① is active. When $A_i^1A_i^0=10$, the column calculator ⑤② is active. That is, for any value of an $i^{th}$ bit $A_i$ of the input data A, only one column calculator is active. That is, only one column calculator may output a high level at any moment.

2. In view of that only one of the three column calculators may output a high level at any moment, the remaining two input electrodes column calculators all output a low level. Therefore, an output signal combiner ⑤③ is formed by two 3-input OR gates ⑥⑥ and ⑥⑦. ⑥⑥ performs OR on low bit values of output signals of the three column calculators to generate a low bit $C_i^0$ of an output signal of the $i^{th}$ calculator bit. ⑥⑦ performs OR on high bit values of output signals of the three column calculators to generate a high bit $C_i^1$ of an output signal of the calculator bit.

3. Because the differences among the three column calculators only lie in that the structures of the A signal selectors ⑤⑥, ⑥⑧, and ⑥⑨ are different, and the remaining parts are identical, only the column calculator ⑤⓪ is described below.

The latch ⑥① is a reconfiguration command latch. A value (reconfiguration command) that is written into the latch ⑥① determines an electronic operator's function of ⑤⓪. The lowest two bits (G1 and G0) of ⑥① are connected to input port selection terminals (C1 and C0) of the 4-to-1 selector ⑥④. Therefore, the values of G1 and G0 determine which of the four input ports (D3 to D0) of ⑥④ is in communication with an output port O. See Table 5 for a gating relationship.

TABLE 5

| Gating relationship between output ports and input ports of the 4-to-1 selector | | | | |
|---|---|---|---|---|
| C1C0 | 00 | 01 | 10 | 11 |
| Input Port | D0 | D1 | D2 | D3 |

The G2 bit of the latch ⑥① controls the NOT function of the XOR gate ⑥③. When G2=1, the XOR gate ⑥③ performs NOT on a signal outputted by the port O of ⑥①. When G2=0, ⑥③ does not perform NOT on the signal outputted by the port O. An output signal of the XOR gate ⑥③ is connected to an input terminal of the AND gate ⑥②. Therefore, when an input of another input terminal (the control terminal) of ⑥② is 1 (a high level), ⑥② is open to the output signal of ⑥③. That is, an output level of ⑥② is kept consistent with an output level of ⑥③. Therefore, an output signal of ⑥③ becomes a high bit value $C_i^{01}$ of an operational result of the column calculator ⑤⓪. Therefore, the lowest three bits (G2, G1, and G0) of the reconfiguration latch ⑥① determine which value of which input port of the 4-to-1 selector ⑥④ can enable the high bit $C_i^{01}$ of the output signal of the column calculator ⑤⓪ to be at a high level. Similarly, the highest three bits (G6, G5, and G4) of the latch ⑥① determine which value of which input port of the 4-to-1 selector ⑤⑨ can enable $C_i^{00}$ in the output signal of the column calculator ⑤⓪ to be at a high level.

4. The middle bit G3 of the latch ⑥① is connected to an input terminal (the control terminal of the work permitter) of the AND gate ⑤⑤. When G3=1, ⑤⑤ is open to another input terminal, that is, open to an output signal of the A signal selector ⑤⑥. If ⑤⑥ outputs a high level, ⑤⑤ also outputs a high level. Therefore, the AND gate ⑤④ also outputs a high level. In this case, the column calculator ⑤⓪ is in an active state, and is a current working part of the $i^{th}$ calculator bit. When G3=0, the AND gate ⑤⑤ definitely outputs a low level, that is, is closed to another input terminal. Therefore, the output of the AND gate ⑤④ is also always at a low level.

Therefore, the AND gates (57) and (62) also always output a low level. That is, $C_i^{00}$ and $C_i^{01}$ both have a 0 value, and do not effect in OR gates (66) and (67). It is functionally implemented that the column calculator (50) is inactive, that is, does not participate in the operation of the $i^{th}$ calculator bit. In this case, a logic operation truth table that the $i^{th}$ calculator bit follows is equivalent to a 3×2 table that remains after a corresponding column is deleted from Table 1. Therefore, G3 determines whether the column calculator (50) is a part of the $i^{th}$ bit of a current logic operator.

Obviously, if the logic operation truth table that the operator currently follows is a 3×2 table, G3=0 needs to be set in reconfiguration latches of column calculators corresponding to missing columns in the table.

5. The input signals of the 4-to-1 selectors (59) and (64) are identical. Only the input signals and function of (59) are described below. A two-bit binary symbol $B_i^1 B_i^0$ of an $i^{th}$ bit $B_i$ of input data B undergoes NOR by (60) before being fed into a D0 terminal, and therefore the D0 terminal is connected to a high level only when $B_i^1 B_i^0 = 00$. $B_i^0$ is directly fed into a D1 terminal, and therefore the D1 terminal is connected to a high level provided that $B_i^0 = 1$. $B_i^1$ is directly fed into a D2 terminal, and therefore the D2 terminal is connected to a high level provided that $B_i^1 = 1$. Vcc is directly fed into a D3 terminal, and therefore D3 is connected to a high level regardless of the value of the B data.

As can be seen from Table 3, when selection terminals C1 and C0 of (59) are 00, the D0 input port is gated. In this case, only the value of D0 is transmitted to the port O for output, and values of other input ports cannot pass through (59). The only way of enabling C1 and C0 of (59) to be 00 is to write 00 into G5 and G4 of the latch (61). If 0 is also written into G7, when $B_i^1 B_i^0 = 00$, an input of the D0 port of (59) is at a high level, and as a result the port O of (59) outputs a high level, to further enable the XOR gate (58) to output a high level and enable the AND gate (57) to output a high level. Therefore, the output $C_i^{00}$ of the column calculator is at a high level. When $B_i^1 B_i^0 \neq 00$, $C_i^{00}$ is at a low level. Similarly, see Table 6 for the impact of G6, G5, and G4 of (61) having other values on the value of the output value of $C_i^{00}$ may be analyzed.

TABLE 6

Relationship between a ternary logic reconfiguration value and an output (a low bit) of a column calculator

| G6 | x | 0 | 0 | 0 | 0 | 1 | 1 | 1 | 1 |
|---|---|---|---|---|---|---|---|---|---|
| G5G4 | xx | 00 | 01 | 10 | 11 | 00 | 01 | 10 | 11 |
| G3 | 0 | 1 | 1 | 1 | 1 | 1 | 1 | 1 | 1 |
| B1B0 = 00 | Not | 1 | 0 | 0 | 1 | 0 | 1 | 1 | 1 |
| B0 = 1 | working | 0 | 1 | 0 | 1 | 1 | 0 | 1 | 1 |
| B1 = 1 | | 0 | 0 | 1 | 1 | 1 | 1 | 0 | 1 |

In consideration of that the impact of G2, G1, and G0 on the output value of $C_i^{00}$ is identical with the impact of G6, G5, and G4 on the output value of $C_i^{00}$, a value that should be written into the latch (61) when one column calculator is configured into a specific column calculator may be determined from Table 6. This value is referred to as a column reconfiguration command. Correspondingly, (61) is referred to as a column reconfiguration latch.

6. Based on Table 6, each bit of the m-bit operator may be reconfigured into one bit of a ternary logic operator, so that the entire operator becomes a composite operator having various ternary logic operators. A sum of quantities of bits of the logic operators is m. A large amount of original data may then be calculated piece by piece in the operator. Specific operations are as follows:

1) Write a truth table for required logic operation. Refer to Table 1.

2) If the truth table lacks a column, write 0 into a G3 bit of a column calculator corresponding to the column. If the truth table lacks a row, rows and columns of the truth table are exchanged to obtain a truth table that lacks a column.

3) Look up Table 6 according to the locations of 1 in the truth table, and write the values of G6 to G0.

4) Write G6 to G0 into the reconfiguration latch (61) of each column calculator.

5) Write the original data pair by pair into data input terminals A and B of calculator bits.

6) Obtain a calculation result at a terminal C of an calculator bit.

Embodiment 3

Figure 4:
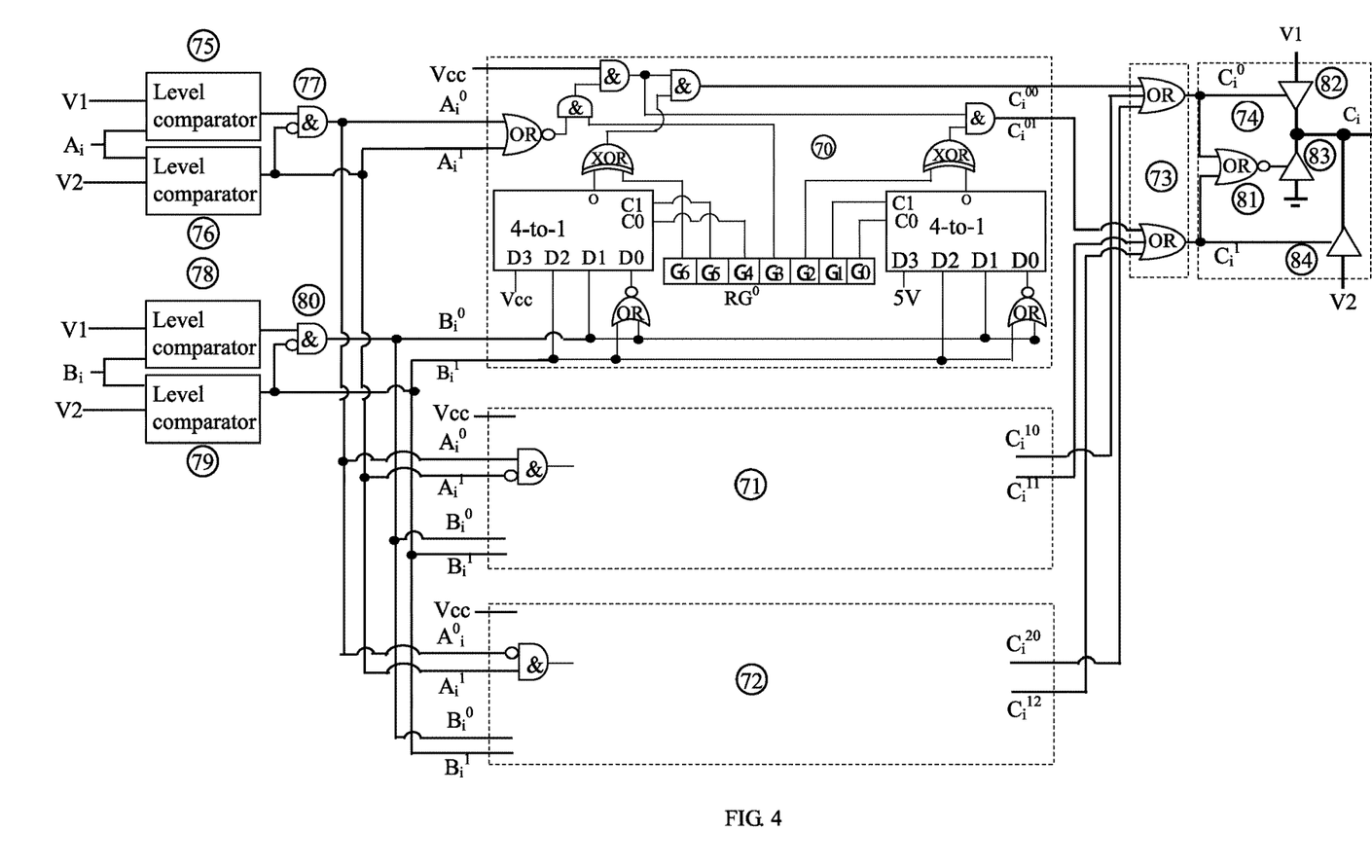
FIG. 4 is a schematic structural diagram of an electronic operator according to Embodiment 3 of the present invention, describing a specific structure of a groupable and reconfigurable ternary electronic operator with multiple bits, characterized by that a one-bit ternary symbol is used to represent ternary logic operation.

The structure of a ternary logic electronic operator represented by using a one-bit ternary symbol is described in this embodiment. The electronic operator may have m bits. Each bit has the same structure and working principle, as shown in FIG. 4. Therefore, only an $i^{th}$ bit of the electronic operator is described in detail with reference to FIG. 4 in the Description, where i=0, 1, . . . , m−1.

In this embodiment, three symbols 0, 1, and 2 are selected to represent ternary data, and respectively represent three stable levels: V0 volts, V1 volts, and V2 volts, and V0<V1<V2, for example, 0 volts, 2.7±0.2 volts, and 4.80.2 volts.

See FIG. 4 for the specific structure and devices of the circuit of an $i^{th}$ calculator bit. The calculator bit includes three column calculators (70), (71), and (72), a combiner (73) for output signals of the column calculators, and a signal merger (74). As can be seen from the comparison with the structural diagram (FIG. 3) in Embodiment 2, this embodiment is obtained by making changes to Embodiment 2. There are three changes as follows:

The first change is that level comparators (75) and (76) and an AND gate (77) are added, which are used to convert an input signal $A_i$ from a one-bit ternary signal into two-bit binary signals $A_i^0$ and $A_i^1$, to form an input signal $A_i$ the same as that in Embodiment 2. The working principle of the level comparators (75) and (76) and the AND gate (77) is as follows: When the value of $A_i$ is V0 volts, both (75) and (76) output a low level. Because (75) outputs a low level, (77) also outputs a low level. Therefore, $A_i^0$ and $A_i^1$ are both at a low level. In this case, $A_i^1 A_i^0 = 00$. When the value of $A_i$ is V1 volts, (75) outputs a high level, and (76) outputs a low level. NOT is performed on the output of (76) to obtain a high level. The high level of (76) and the high level outputted by (75) are both inputted into (77). Therefore, (77) outputs a high level. Therefore, $A_i^0$ is at a high level, and $A_i^1$ is still at a low level. In this case, $A_i^1 A_i^0 = 01$. When the value of $A_i$ is V2 volts, (75) and (75) both output a high level. NOT is performed on the output of (76) to obtain a low level. After the low level of (76) is inputted into (77), (77) outputs a low level. Therefore, $A_i^0$ is at a low level, and $A_i$ is at a high level. In this case, $A_i^0 A_i^0 = 10$.

The second change is that level comparators (78) and (79) and an AND gate (80) are added, which are used to convert an input signal $B_i$ from a one-bit ternary signal into two-bit binary signals $B_i^0$ and $B_i^1$, to form an input signal $B_i$ the same as that in Embodiment 2. The working principle of the level comparators (78) and (79) and the AND gate (80) is the same as that of ⑦⑤, ⑦⑥, and ⑦⑦ in changing an $A_i$ signal. Details are not described again.

The third change is that a signal merger ⑦④ is added at a signal output terminal. The signal merger converts two-bit binary signals $C_i^1$ and $C_i^0$ outputted in Embodiment 3 into a one-bit ternary signal Ci. The working principle of the signal merger ⑦④ is as follows: When $C_i^1 C_i^0=00$, $C_i^0$ closes a high-resistance gate ⑧②, $C_i^1$ closes a high-resistance gate ⑧④, and $C_i^1$ and $C_i^0$ enter the OR gate ⑧①. NOT is performed on the low level outputted by ⑧① to obtain a high level. The high level of ⑧① opens the high-resistance gate ⑧③. Therefore, a current level of an output terminal $C_i$ of the $i^{th}$ calculator bit formed by connecting the output terminal of ⑧②, the output terminal of ⑧③, and the output terminal of ⑧④ together is 0 volts (a V0 value). When $C_i^1 C_i^0=01$, $C_i^0$ opens the high-resistance gate ⑧②, $C_i^1$ closes the high-resistance gate ⑧④, and $C_i^1$ and $C_i^0$ enter the OR gate ⑧①. NOT is performed on the high level outputted by ⑧① to obtain a low level. The low level of ⑧① closes the high-resistance gate ⑧③. Therefore, the current level of the output terminal $C_i$ of the $i^{th}$ calculator bit formed by connecting the output terminal of ⑧②, the output terminal of ⑧③, and the output terminal of ⑧④ together is V1 volts. When $C_i^1 C_i^0=10$, $C_i^0$ closes the high-resistance gate ⑧②, $C_i^1$ opens the high-resistance gate ⑧④, and $C_i^1$ and $C_i^0$ enter the OR gate ⑧①. NOT is performed on the high level outputted by ⑧① to obtain a low level. The low level of ⑧① closes the high-resistance gate ⑧③. Therefore, the current level of the output terminal $C_i$ of the $i^{th}$ calculator bit formed by connecting the output terminal of ⑧②, the output terminal of ⑧③, and the output terminal of ⑧④ together is V2 volts.

In view of that ⑦⓪, ⑦①, ⑦②, and ⑦③ in Embodiment 3 are identical with ⑤⓪, ⑤①, ⑤②, and ⑤③ in Embodiment 2, ⑦⓪, ⑦①, ⑦②, and ⑦③ are not described in detail again in the Description.

Embodiment 4

Two level values, namely, a low level of 0 V and a high level of Vcc, are selected to represent information, and are respectively denoted by symbols 0 and 1. The circuits of calculator bits of a binary logic electronic operator in this embodiment are identical. Therefore, only the circuit of the $i^{th}$ calculator bit is described in detail in the Description.

Figure 5:
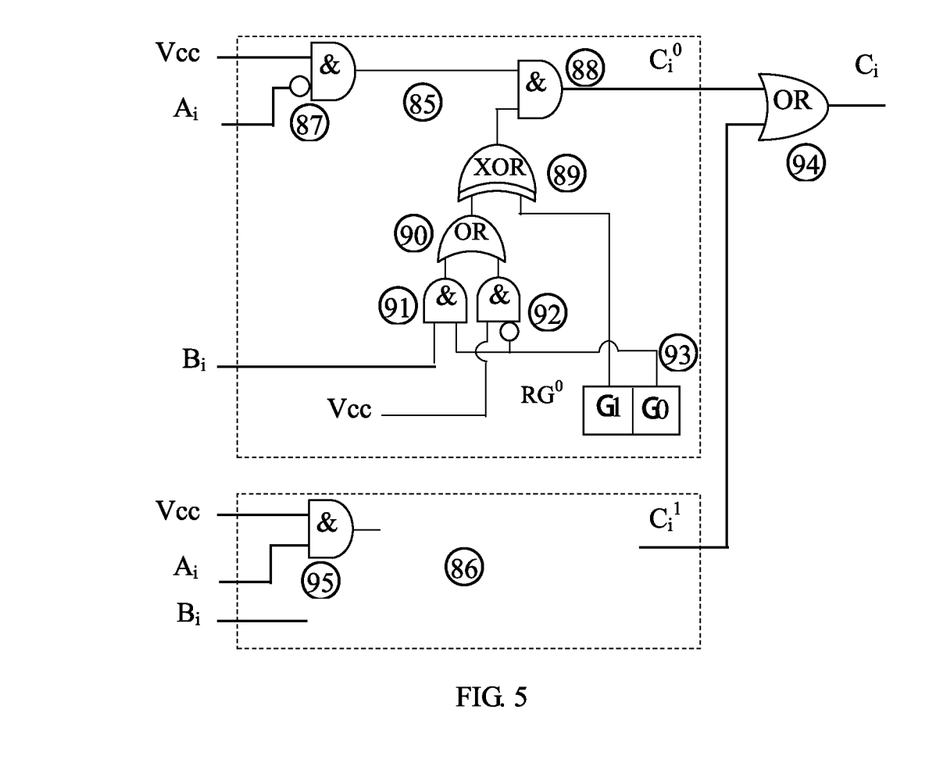
FIG. 5 is a schematic structural diagram of electronic operator according to Embodiment 4 of the present invention, describing a specific structure of a groupable and reconfigurable binary electronic operator with multiple bits, characterized by that a one-bit binary symbol is used to represent binary logic operation.

See FIG. 5 for the specific structure and devices of the circuit of the $i^{th}$ calculator bit. The calculator bit includes two column calculators ⑧⑤ and ⑧⑥ and a combiner, that is, an OR gate ⑨④, for two output signals of the column calculators.

The column calculator includes four AND gates ⑧⑦, ⑧⑧, ⑨①, and ⑨②, one XOR gate ⑧⑨, one OR gate ⑨⓪, and one two-bit latch ⑨③. The connection relationships among the elements are as follows: An $i^{th}$ bit signal $A_i$ of input data A that has undergone NOT and a power supply Vcc are respectively connected to an input terminal of the AND gate ⑧⑦. An output of ⑧⑦ is connected to an input terminal (the result generation control terminal) of the AND gate ⑧⑧. An output signal of ⑧⑧ form an output signal $C_i^0$ of the column calculator, and is connected to an input terminal of the OR gate ⑨④. Another input terminal of ⑨④ comes from an output signal $C_i^1$ of the column calculator ⑧⑥. In another aspect, an $i^{th}$ bit signal $B_i$ of input data B is connected to an input terminal of the AND gate ⑨①. Another input terminal of ⑨① is connected to a low bit G0 (a B signal selection bit) of the latch $RG_i^0$ ⑨③. A power supply Vcc is connected to the AND gate ⑨②. Another input terminal of ⑨② is connected to a signal obtained after NOT is performed on a low bit G0 of the latch $RG_i^0$ ⑨③. An output terminal of the AND gate ⑨① and an output terminal of ⑨② are respectively connected to an input terminal of the OR gate ⑨⓪. An output terminal of ⑨⓪ is connected to an input terminal of the XOR gate ⑧⑨. Another input terminal of ⑧⑨ is connected to a high bit G1 (NOT is performed on the control bit) of the latch $RG_i^0$ ⑨③. An output terminal of ⑧⑨ is connected to an input terminal of the AND gate ⑧⑧.

The working principle of the column calculator ⑧⑤ is that when $A_i=0$, the AND gate ⑧⑦ (the A signal selector) outputs a high level, and the column calculator ⑧⑤ is in an active state. In this case, a control terminal of the AND gate ⑧⑧ (the result generator) is 1. A signal of the output terminal of the XOR gate ⑧⑨ can be outputted by ⑧⑧ to form a low bit $C_i^0$ of a calculation result of the column calculator. In this case, the AND gate ⑨⑤ in another column calculator ⑧⑥ is controlled by $A_i=0$ to always output a 0 value. That is, $C_i^1=0$. Therefore, in this case, the output value of the $i^{th}$ calculator bit is $C_i=C_i^0$. Similarly, when $A_i=1$, the AND gate ⑧⑦ outputs a low level, and the AND gate ⑨⑤ outputs a high level. Therefore, the column calculator ⑧⑥ is in an active state, and ⑧⑤ is inactive. Therefore, $C_i=C_i^1$.

When the column calculator ⑧⑤ is active, if 1 has been written in the low bit G0 of the latch $RG_i^0$ ⑨③, the AND gate ⑨② is closed, and the output is always a 0 value. The AND gate ⑨① is open to the signal of the input data $B_i$. $B_i$ passes through ⑨① and the OR gate ⑨⓪ to form an input signal of the XOR gate ⑧⑨. If the low bit G of ⑨③ has been reset to 0, the AND gate ⑨① is closed, and an output of ⑨① is always a 0 value. The AND gate ⑨② is open to Vcc. Vcc passes through ⑨② and the OR gate ⑨⓪ to form an input signal of the XOR gate ⑧⑨. Because the high bit G1 of the latch $RG_i^0$ ⑨③ is connected to another input terminal of the XOR gate ⑧⑨, if 1 has been written into G1, ⑧⑨ is controlled to perform NOT on a signal of another input terminal. If G1 has been reset to 0, ⑧⑨ is controlled to not perform NOT on a signal of another input terminal. Therefore, the value written into the latch $RG_i^0$ determines the logic operation function of the column calculator ⑧⑤. The value written into $RG_i^0$ is referred to as a reconfiguration command. See Table 7 for the specific function of the value.

TABLE 7

| Relationship between a binary logic reconfiguration value and an output (a low bit) of a column calculator | | | | |
|---|---|---|---|---|
| G1 G0 | 00 | 01 | 10 | 11 |
| Bi = 0 | 1 | 0 | 0 | 1 |
| Bi = 1 | 1 | 1 | 0 | 0 |

Preferred specific embodiments of the present invention are described above in detail. It should be understood that a person of ordinary skill in the art may make various modifications and changes according to the concept of the present invention without creative efforts. Therefore, the technical solutions that may be obtained by a person skilled in the art through logic analysis, inference or limited experiments based on the prior art according to the concept of the present invention shall all fall within the protection scope determined by the claims.

We claim:

1. A many-bit, groupable, reconfigurable, multi-valued, electronic operator; wherein each bit of the multi-value electronic operator comprises a plurality of column calculator and a potential combiner; output terminals of the column calculators are respectively connected to an input terminal of the potential combiner;

each column calculator comprises an output validator, an output generator, an A signal selector, a work permitter, a reconfiguration latch, and a reconfiguration circuit;

an input terminal of the A signal selector is connected to a data input line A, and an output terminal of the A signal selector is connected to an input terminal of the work permitter; an output terminal of the work permitter is connected to a control terminal of the output validator, and a control terminal of the work permitter is connected to an output terminal of a work permit bit in the reconfiguration latch; an input terminal of the reconfiguration latch is connected to a reconfiguration command input line G; an output terminal of the work permit bit in the reconfiguration latch is connected to the control terminal of the work permitter, and output terminals of other bits in the reconfiguration latch are respectively connected to a control terminal of the reconfiguration circuit; an input terminal of the reconfiguration circuit is connected to a data input line B, and an output terminal of the reconfiguration circuit is connected to an input terminal of the output generator; and a control terminal of the output generator is connected to an output terminal of the output validator; an output terminal of the output generator is connected to the input terminal of the potential combiner; and the potential combiner is set as: an $i^{th}$ potential combiner combines output signals of all the column calculators comprised in an $i^{th}$ calculator bit together, to form a physical signal output of an $i^{th}$ bit of the multi-value electronic operator; wherein i=0, 1, ..., m−1; m is a positive integer.

2. The many-bit, groupable, reconfigurable, multi-valued, electronic operator of claim 1, wherein the electronic operator comprises a plurality of calculator bits; each calculator bit comprises n column calculators; and the n column calculators are set to have a same structure; wherein n is a positive integer greater than 1.

3. The many-bit, groupable, reconfigurable, multi-valued, electronic operator of claim 2, wherein the electronic operator comprises m bits, and an output signal of an $i^{th}$ bit of the electronic operator is $C_i$ (n-value); i=0, 1, 2, ..., m−1; and each bit of the electronic operator is provided with n column calculators, output signals of the column calculators are set to $C_i^k$ (i=0, 1, ..., m−1, and k=0, 1, ..., n−1), each output signal $C_i^k$ is a binary value signal; and all the $C_i^k$ signals comprise n different signals.

4. The many-bit, groupable, reconfigurable, multi-valued, electronic operator of claim 2, wherein the input terminal of the reconfiguration latch is set to be connected to the reconfiguration command input line G; the reconfiguration command input line G is configured to write a reconfiguration command into the reconfiguration latch through a signal line of G; a G signal is a binary signal, and the reconfiguration command is generally binary data; and output terminals of a plurality of bits for setting electronic operator's function in the reconfiguration latch are connected to the control terminal of the reconfiguration circuit; and the plurality of bits for setting the electronic operator's function in the reconfiguration latch are configured to control the reconfiguration circuit for a filtering of a signal of a $kt^h$ bit of data B fed into a $kt^h$ line of the data input line B of the input terminal of the reconfiguration circuit; wherein k=0, 1, ..., n−1.

5. The many-bit, groupable, reconfigurable, multi-valued, electronic operator of claim 4, wherein the reconfiguration circuit comprises p branches of same structure; p is set to the smallest integer greater than the square root of n; each branch of the reconfiguration circuit is configured to perform, according to a signal status of a control terminal of the branch of the reconfiguration circuit, selection and simple conversion on a value fed into the input terminal; and the selected and converted results are transmitted to a path of the input terminal of the output generator through an output terminal of the branch of the reconfiguration circuit; and the input terminal of the output generator comprises p input lines.

6. The many-bit, groupable, reconfigurable, multi-valued, electronic operator of claim 2, wherein the control terminals of the output validator and the work permitter are set to be selective conduction; the selective conduction is defined as when a signal at a control terminal of the device is at a high level, the input terminal and the output terminal of the device are set to be conducted; and when a signal at the control terminal is at a low level, no conduction is set between the input terminal and the output terminal of the device; and a low level is outputted.

7. The many-bit, groupable, reconfigurable, multi-valued, electronic operator of claim 3, wherein the input terminal of the A signal selector is set to be connected to a line with a same sequence number in the data input line A as the number of a calculator bit where the A signal selector is located; the data input line A is set as a data input line with m bits and n values; and an $i^{th}$ signal line of A is connected to the input terminal of the A signal selector of each column calculator of the $i^{th}$ calculator bit.

8. The many-bit, groupable, reconfigurable, multi-valued, electronic operator of claim 3, wherein the input terminal of the reconfiguration circuit is further connected to the data input line B, the data input line B is set as a data input line with m bits and n values, and an $i^{th}$ signal line of B is connected to the input terminal of the reconfiguration circuit of each column calculator of the $i^{th}$ calculator bit.

9. The many-bit, groupable, reconfigurable, multi-valued, electronic operator of claim 1, wherein output signals of output terminals of the column calculators are set to $C_i^k$ (n-value) (i=0, 1, ..., m−1, and k=0, 1, ..., n−1); the output signals are set to be inputted into a group of input terminals the input terminals of the potential combiner; one level V with n values is also inputted into another input terminal of the potential combiner; the potential combiner is configured to select, according to an input signal $C_i^k$ at a high level, a corresponding value of a level V for output to form an output signal $C_i$ (n-value) (i=0, 1, ..., m−1) of the $i^{th}$ calculator bit; and output signals Ci (n-value) (i=0, 1, ..., m−1) of all the calculator bits constitute output signals of m output terminals of the electronic operator.

10. A method of using the many-bit, groupable, reconfigurable, multi-valued, electronic operator of claim 1, comprising:

step 1, writing, through the reconfiguration command input line G, a reconfiguration command into the reconfiguration latch of each column calculator of a required calculator bit;

step 2, sending a pair of current values of original data to the data input line A and the data input line B respectively;

step 3, receiving calculation results of the output terminals of all the calculator bits; and step 4, repeating step 2 and step 3 such that all original data have been calculated.

* * * * *